(12) United States Patent
Boyden et al.

(10) Patent No.: US 7,885,066 B2
(45) Date of Patent: Feb. 8, 2011

(54) AIRFLOW/COOLING SOLUTION FOR CHASSIS WITH ORTHOGONAL BOARDS

(75) Inventors: Demick Boyden, Pleasanton, CA (US); Pradeep Sindhu, Los Altos Hills, CA (US); Keith J. Hocker, Cupertino, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 103 days.

(21) Appl. No.: 12/175,291

(22) Filed: Jul. 17, 2008

(65) Prior Publication Data

US 2010/0014248 A1   Jan. 21, 2010

(51) Int. Cl.
*H05K 7/20* (2006.01)
*G06F 1/20* (2006.01)
*H05K 5/00* (2006.01)
*A47B 77/08* (2006.01)

(52) U.S. Cl. .............. 361/695; 361/679.49; 361/679.5; 361/679.51; 454/184; 312/236

(58) Field of Classification Search ......... 361/688–695, 361/724–727, 679.46–679.51; 454/84; 312/326
See application file for complete search history.

(56) References Cited

U.S. PATENT DOCUMENTS

| | | | |
|---|---|---|---|
| 4,399,485 A * | 8/1983 | Wright et al. | 361/693 |
| 7,593,229 B2 * | 9/2009 | Shuy | 361/705 |
| 2005/0207134 A1 * | 9/2005 | Belady et al. | 361/796 |
| 2006/0120038 A1 * | 6/2006 | Lucero et al. | 361/694 |
| 2008/0013276 A1 * | 1/2008 | Pyle | 361/695 |

* cited by examiner

*Primary Examiner*—Zachary M Pape
*Assistant Examiner*—Jerry Wu
(74) *Attorney, Agent, or Firm*—Sanford E. Warren, Jr.; Akin Gump Strauss Hauer & Feld

(57) ABSTRACT

A front-to-back cooling system allows cooling of an apparatus containing two orthogonal sets of modules. A vertical set of modules is cooled with vertical air flow across the modules that enters from a front of the apparatus and exits from the back of the apparatus. A horizontal set of modules is cooled with air flow that passes through openings in a midplane connecting the two sets of modules.

15 Claims, 4 Drawing Sheets

AIRFLOW/COOLING SOLUTION FOR CHASSIS WITH ORTHOGONAL BOARDS

TECHNICAL FIELD

The present invention relates to the field of cooling systems, and in particular to cooling of a modular chassis with orthogonal modules.

BACKGROUND ART

Systems that require very high bandwidth any-to-any connectivity among a set of modules typically use an orthogonal mid-plane configuration. In this configuration, a set of cards are plugged into the front side of the mid-plane in vertical configuration and another set of cards are plugged into the rear side of the mid-plane in horizontal configuration. This layout enables each front card to be directly connected to each rear card, and makes it possible to eliminate the use of PCB signal traces on the mid-plane to carry high speed signals.

However, the orthogonal configuration also creates a cooling challenge, especially in applications where front-to-back cooling is required. Vertical cards can be cooled using conventional cooling mechanisms with front air intake and rear air exhaust, but cooling the horizontal cards while maintaining overall front-to-back air flow is challenging.

If front-to-back cooling is not required, the horizontal card cage can be cooled using side-to-side air flow. However, many rack mount environments require front-to-back air cooling. One solution has been to divert air taken from a front intake to the back and run it up in a column next to the horizontal cards. Such a mechanism typically uses a set of fans or blowers to create the air pressure across the horizontal cards. However, the amount of air flow that is provided in such a system is typically limited due the number of turns in the air path. Also, the placement of one or two fan blades along the sides of the horizontal cards can severely limit the PCB area and panel surface that is available.

SUMMARY OF INVENTION

In one embodiment, a method of cooling an apparatus, comprises defining a plenum, positioned between a pair of a first plurality of modules, forming an opening in a midplane, the midplane electrically connecting the first plurality of modules with a second plurality of modules oriented orthogonally to the first plurality of modules, the opening in fluid communication with the plenum, moving air from a front of the apparatus through the plenum, through the opening, and across a surface of a module of the second plurality of modules, and exhausting the air at a rear of the apparatus.

In another embodiment, an apparatus, comprises a first plurality of modules, a second plurality of modules, mounted orthogonally to the first plurality of modules, a midplane, positioned between and electrically connecting the first plurality of modules and the second plurality of modules, the midplane having an opening formed through the midplane and adapted to allow air movement through the midplane, a plenum defined between a pair of the first plurality of modules, in fluid communication with the opening, and a fan configured to move air through the opening from the plenum and across a surface of a module of the second plurality of modules.

In yet another embodiment, an apparatus, is disclosed comprising a chasis a first plurality of modules mounted in the chassis, a second plurality of modules mounted in the chassis orthogonally to the first plurality of modules, a midplane, positioned between and electrically connecting the first plurality of modules and the second plurality of modules, means for providing fluid communication from a front of the chassis through an opening formed in the midplane, and means for moving air through the opening.

BRIEF DESCRIPTION OF DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

DESCRIPTION OF EMBODIMENTS

Figure 1:
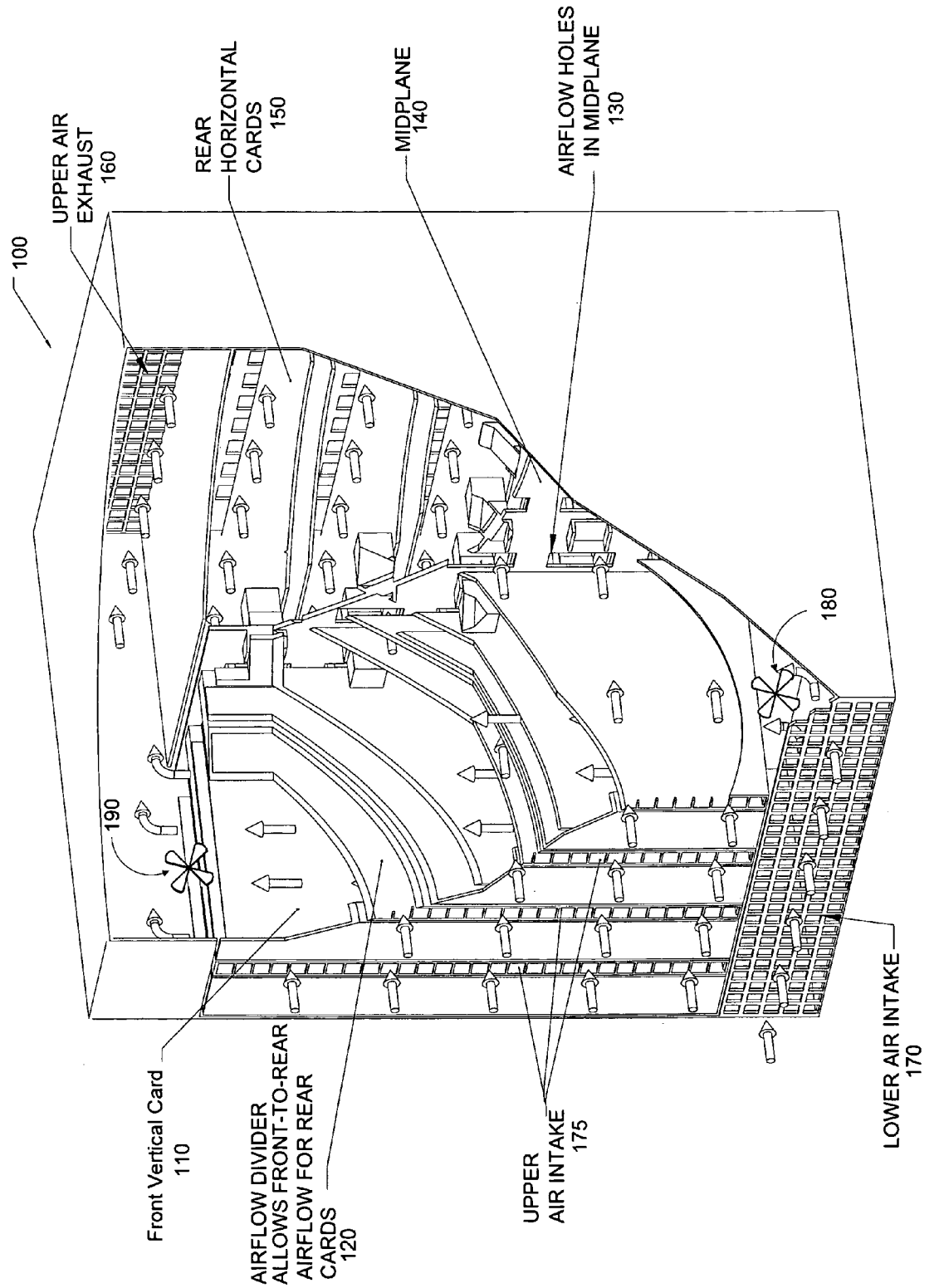
FIG. 1 is a cutaway perspective view illustrating a chassis and plenums according to one embodiment.

FIG. 1 is a cutaway perspective view of a chassis 100. A plurality of modules 110, typically circuit boards, are mounted in a vertical orientation in the front of the chassis 100. A plurality of modules 150, also typically circuit boards, are mounted orthogonally to the plurality of modules 110 and a horizontal orientation in the rear of the chassis 100. A midplane 140 is positioned between the modules 110 and the modules 150 to electrically connect the modules 110 and 150. A plurality of openings or holes is formed through the midplane 140 to allow air flow to the rear modules 150.

As shown in FIG. 1, the plurality of openings 130 is distributed evenly across the midplane 140, but this arrangement and number of holes is exemplary and illustrative only and any desired arrangement and number of openings 130 can be formed in the midplane 140 as needed because of heating characteristics of the modules 150. For example, if some of the modules 150 generate more heat than others of the modules 150, then the midplane 140 may have more openings 130 to provide more air flow to the hotter modules 150. Similarly, if some portions of one of the modules 150 require more cooling than others, more or bigger holes could be placed at or near that portion of the modules 150, while fewer or smaller holes 130 could be placed near the cooler portion of the modules 150. At least one opening 130 must correspond to each of the rear modules 150. The openings 130 are preferably sized to provide sufficient air flow across the rear modules 150 to provide appropriate cooling for the modules 150. More than one opening 130 may be formed for each horizontal module 150 as desired and as electrical circuit positioning constraints on the midplane 150 allow.

Figure 2:
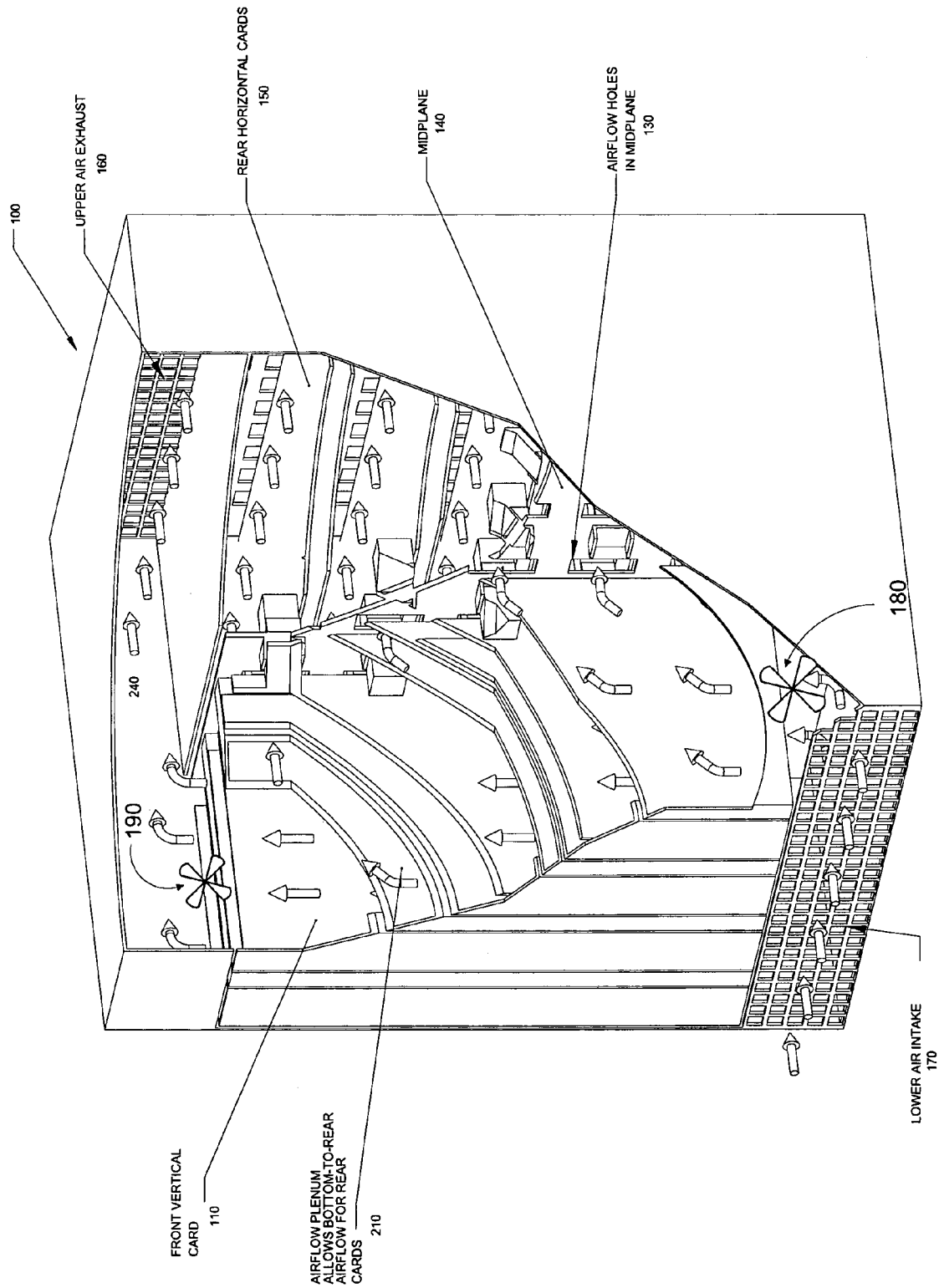
FIG. 2 is a cutaway perspective view illustrating a chassis and plenums according to a second embodiment.
Figure 3:
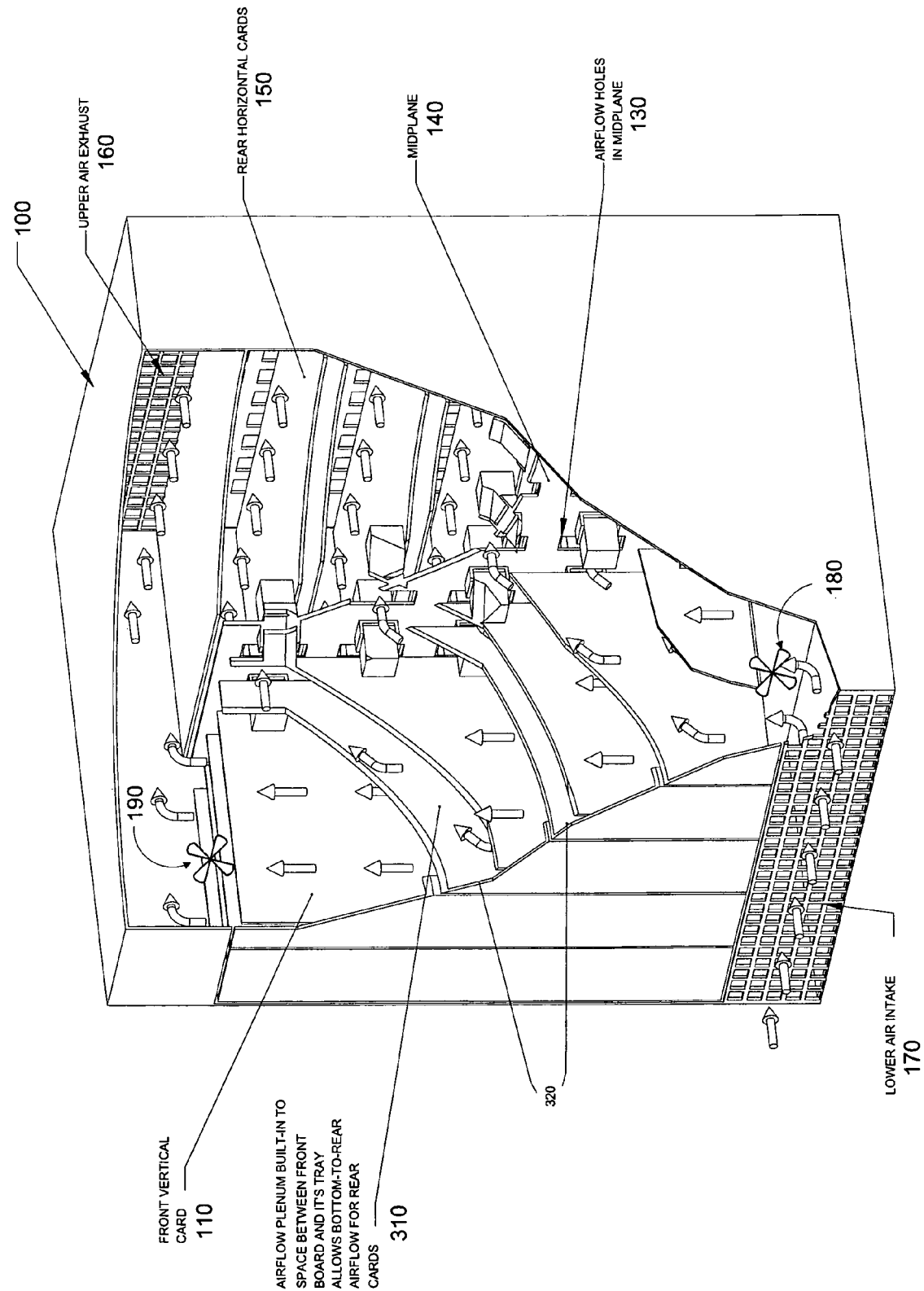
FIG. 3 is a cutaway perspective view illustrating a chassis and plenums according to a third embodiment.

Heated air from the first and second plurality of modules is exhausted rearwards from the horizontal modules 150 and the vertical modules 110 through exhaust outlets 160 on the rear of the chassis 100. In FIGS. 1-3, air flow across the vertically oriented modules 110 is driven by a lower fan tray 180 containing fans that take air from a lower air intake 170 and blow air vertically across the modules 110. An upper fan tray 190 can provide additional air flow to take heated air from the vertical modules 110 and exhaust the air to the rear of the chassis 100 through a plenum 240 through exhaust outlets 160.

The embodiment of FIG. 1 provides a plurality of plenums 120 that allow air flow from a plurality of front inlets 175 of the chassis 100 through one or more of the openings 130 in the midplane 140. Two walls, closed at the top and bottom form a rectangular plenum 120 open to the front of the chassis 100 through upper air intakes 175. The pitch of the modules 110 must be sufficient to allow placement of the plenums 120 between a pair of modules 110. In some embodiments, the plenums 120 provide at least a one quarter inch air gap, but preferably, the plenums 120 provide at least a one half inch air gap. In this embodiment, the cooling of the front vertical modules 110 is independent of the cooling of the rear horizontal modules 150. Preferably, in embodiments similar to that illustrated in FIG. 1, negative pressure is used to pull air from the upper front intakes 175 through the plenum 120 and openings 130. The air is then drawn across the surface of the rear modules 150 and exhausted through rear outlets 160.

Figure 4:
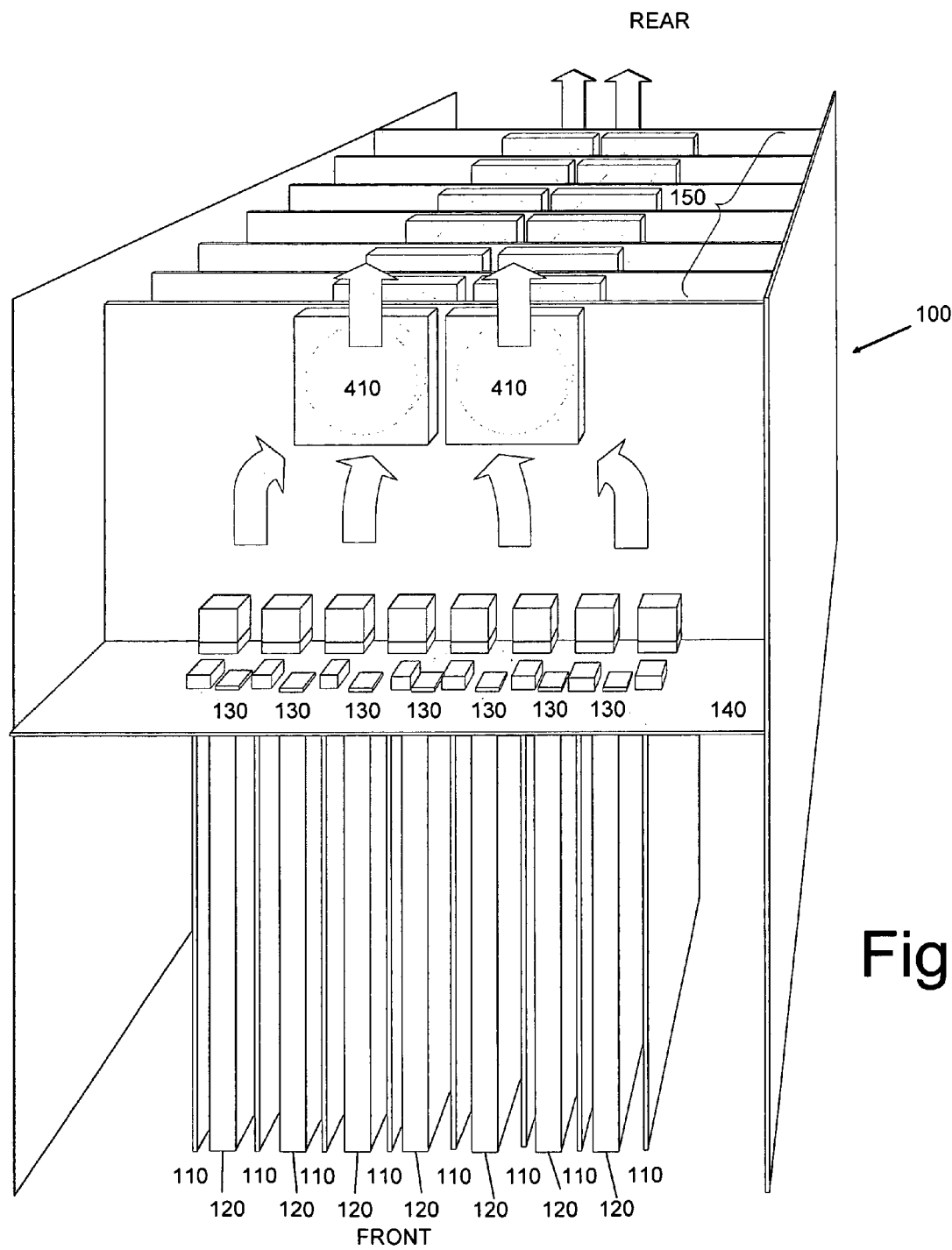
FIG. 4 is a top perspective view of the embodiment of FIG. 1.

Not shown in FIG. 1 are the fans or blowers used to move the air for the rear modules 150 when negative pressure is used. FIG. 4 is a top perspective view of the chassis 100 illustrating an exemplary fan configuration. As shown in FIG. 4, two fans or blowers 410 on each rear module 150 pull air from the openings 130 in the midplane 140. In other embodiments, a single fan or blower 410 could be used, typically in a central rear position. Alternatively, one or more fans could be mounted distal to a line from one of the openings 130 to the rear of the chassis 100 at the sides of the modules 150. At least one fan 410 would need to be mounted with each rear module 150 in embodiments such as illustrated in FIGS. 1 and 4.

Although positive pressure and front fans could be used in the embodiments illustrated in FIG. 1 to push air through the plenums 120, the openings 130, and across the rear modules 150, size constraints generally make the negative pressure embodiments shown in FIG. 4 preferable.

FIGS. 2 and 3 illustrate alternative embodiments that divide air flow between the plenums 120 and the vertical front modules 110, using fans in fan tray 180 to push air through the plenums 120 and through the openings 130 to the rear modules 150. In such embodiments, the fans 410 of FIG. 4 may not be necessary to achieve sufficient air flow, but in some embodiments can be used to improve air flow and cooling across the rear modules 150.

In the embodiments illustrated in FIGS. 2 and 3, the plenums 210 and 310 are not open to the front, like the plenums 120, so the upper front air intakes 175 of FIG. 1 are not required. Instead, the plenums 210 and 310 are open to the bottom to allow air to be pushed through the plenums 210 and 310 by the fans of fan tray 180. In embodiments as illustrated in FIG. 2, the plenums 210 are closed on top with vertical walls forming a rectangular plenum 210 where the air makes a turn to exit the plenums 210 through openings 130. As with the embodiments illustrated by FIG. 1, the pitch of the modules must be sufficient to allow insertion of the separate plenum units 210 between a pair of modules 110.

Embodiments illustrated by FIG. 3 are similar to those illustrated by FIG. 2, but instead of using separate plenum units 210, they take advantage of the common practice of mounting modules 110 in a carrier or tray 320 for insertion into the chassis 100. By leaving an air gap between the carriers 320 and a surface, typically an underside, of the modules 110, the carriers 320 and modules 110 together form plenum 310 that can be aligned with openings 130 to provide cooling air flow through the openings 130 to cool the rear modules 150. As with the embodiments illustrated in FIG. 2, air flow is provided by the fans of the fan tray 180 and the air flow is divided between cooling the modules 110 and the plenum 310. In some embodiments, the air gap forming the plenum 310 can be as small as one quarter inch, but preferably the air gap is at least one half inch. The size of the plenums 310 is engineered based on the cooling needs of the rear modules 150. Use of embodiments similar to that illustrated in FIG. 3 avoids the need for separate plenum units 210 and can allow for closer spacing of the modules 110.

In both FIGS. 2 and 3, air passed over the vertical front modules 110 is exhausted through a plenum 240 formed or defined above the horizontal modules 150 and exhausted through upper air exhausts 160.

While certain exemplary embodiments have been described in details and shown in the accompanying drawings, it is to be understood that such embodiments are merely illustrative of and not devised without departing from the basic scope thereof, which is determined by the claims that follow. By way of example and not limitation, the specific electrical components utilized may be replaced by known equivalents or other arrangements of components which function similarly and provide substantially the same result.

We claim:

1. A method of cooling an apparatus, comprising:
defining a plenum, positioned between a pair of a first plurality of modules, forming an opening in a midplane, the midplane electrically connecting the first plurality of modules with a second plurality of modules oriented orthogonally to the first plurality of modules, the opening in fluid communication with the plenum;
moving a first air flow from a front of the apparatus and across a surface of a module of the first plurality of modules;
moving a second air flow from a front of the apparatus through the plenum, through the opening, and across a surface of a module of the second plurality of modules, wherein the second air flow does not contact a surface of the first plurality of modules; and
exhausting the air at a rear of the apparatus.

2. The method of claim 1, further comprising:
positioning a fan on the module of the second plurality of modules,
wherein,
moving air from a front of the apparatus through the plenum, through the opening, and across a surface of a module of the second plurality of modules comprises:
pulling air with the fan through the opening from the plenum across the surface of the module of the second plurality of modules; and
pushing air with the fan out the rear of the apparatus.

3. The method of claim 1, wherein the plenum is open to the front of the apparatus.

4. The method of claim 1, further comprising:
positioning a fan below the first plurality of modules;
wherein the plenum is open to the fan, and
wherein moving air from a front of the apparatus through the plenum, through the opening, and across a surface of a module of the second plurality of modules comprises:
pushing air with the fan into the plenum and through the opening across the surface of the module of the second plurality of modules.

5. The method of claim 1, wherein defining a plenum comprises:
positioning one of the pair of modules in a carrier suitable for mounting in the apparatus;
forming a plenum between a wall of the carrier and a surface of the module, the plenum allowing air movement from beneath the carrier and the module to the opening.

6. An apparatus, comprising:
a first plurality of modules;
a second plurality of modules, mounted orthogonally to the first plurality of modules;
a midplane, positioned between and electrically connecting the first plurality of modules and the second plurality of modules, the midplane having an opening formed through the midplane and adapted to allow air movement through the midplane;
a plenum defined between a pair of the first plurality of modules, in fluid communication with the opening;
a first air flow across a surface of the first plurality of modules;
a second air flow through the opening from the plenum and across a surface of the second plurality of modules, wherein the second air flow does not contact a surface of the first plurality of modules; and
a fan configured to move the second air flow through the opening from the plenum and across a surface of a module of the second plurality of modules.

7. The apparatus of claim 6, wherein the fan is positioned on the surface of the module of the second plurality of modules, and
wherein the fan is configured to pull air from the plenum through the opening across the surface of the module of the second plurality of modules.

8. The apparatus of claim 7, wherein the fan is positioned at a center of a rear edge of the module.

9. The apparatus of claim 7, wherein the fan is positioned distal to a line extending from the opening to a rear edge of the module.

10. The apparatus of claim 6, further comprising:
a front wall of the apparatus, having an opening formed through the front wall, aligned with the opening formed in the midplane;
wherein the plenum comprises:
a pair of walls positioned in parallel and on opposite sides of the opening formed through the front wall and the opening formed through the midplane, adapted to provide fluid communication between the opening through the front wall and the opening through the midplane.

11. The apparatus of claim 6,
wherein the fan is positioned below the first plurality of modules,
wherein the fan is configured to push air through the plenum to the opening through the midplane, and
wherein the plenum comprises:
a pair of walls positioned in parallel and on opposite sides of the opening through the midplane and open to the fan, defining an air path from the fan to the opening through the midplane.

12. The apparatus of claim 6, further comprising: a carrier,
wherein a module of the first plurality of modules is mounted in the carrier, and
wherein a wall of the carrier is spaced apart from a surface of the module,
wherein the plenum is defined between the wall of the carrier and the module.

13. An apparatus, comprising:
a chassis;
a first plurality of modules mounted in the chassis;
a second plurality of modules mounted in the chassis orthogonally to the first plurality of modules;
a midplane, positioned between and electrically connecting the first plurality of modules and the second plurality of modules; and
means for providing fluid communication from a front of the chassis through an opening formed in the midplane;
means for cooling the first plurality of modules with a first air flow;
means for cooling the second plurality of modules with a second air flow, wherein the second air flow does not contact a surface of the first plurality of modules; and
means for moving the second air flow through the opening.

14. The apparatus of claim 13,
the means for moving air comprising:
means for pulling air through the opening and across a surface of a module of the second plurality of modules.

15. The apparatus of claim 13, means for cooling the first plurality of modules, wherein the means for providing fluid communication from a front of the chassis through an opening formed in the midplane is independent of the means for cooling the first plurality of modules.

* * * * *